US006489884B1

(12) United States Patent
Lamberson et al.

(10) Patent No.: US 6,489,884 B1
(45) Date of Patent: Dec. 3, 2002

(54) APPARATUS AND METHOD FOR THE REMOTE MONITORING OF MACHINE CONDITION

(75) Inventors: Roger E. Lamberson, San Diego, CA (US); John T. Barclay, Carlsbad, CA (US); Jim Jun Wei, San Diego, CA (US)

(73) Assignee: SKF Condition Monitoring, San Diego, CA (US)

( * ) Notice: Subject to any disclaimer, the term of this patent is extended or adjusted under 35 U.S.C. 154(b) by 0 days.

(21) Appl. No.: 09/203,040

(22) Filed: Nov. 30, 1998

Related U.S. Application Data

(63) Continuation-in-part of application No. 08/791,246, filed on Jan. 30, 1997, now Pat. No. 5,845,230
(60) Provisional application No. 60/010,839, filed on Jan. 30, 1996.

(51) Int. Cl.[7] ................................................ H04Q 7/00
(52) U.S. Cl. ..................... 340/7.2; 340/7.21; 340/7.29; 340/3.1; 340/870.28; 702/56; 700/174; 73/660; 399/8; 399/9
(58) Field of Search ................... 340/825.44, 870.28, 340/825.06, 7.2, 7.29, 870.29, 3.1, 870.02, 870.03; 73/660; 399/8, 9, 21; 700/174

(56) References Cited

U.S. PATENT DOCUMENTS

| | | | |
|---|---|---|---|
| 4,491,290 A | | 1/1985 | Douglas |
| 4,502,041 A | | 2/1985 | Penzien |
| 4,535,411 A | | 8/1985 | Blackburn et al. |
| 4,559,828 A | * | 12/1985 | Liszka .................... 340/870.28 |
| 4,621,263 A | | 11/1986 | Ttakenaka et al. |
| 4,704,906 A | | 11/1987 | Churchill et al. |
| 4,758,964 A | * | 7/1988 | Bittner et al. ................. 73/660 |
| 4,839,830 A | | 6/1989 | Amey et al. |
| 4,908,785 A | | 3/1990 | Cubbins et al. |
| 4,962,377 A | * | 10/1990 | Wallace et al. ............. 340/7.29 |
| 4,977,516 A | | 12/1990 | Shepherd |
| 5,029,101 A | | 7/1991 | Fernandes |
| 5,034,729 A | | 7/1991 | Lundquist |
| 5,142,278 A | | 8/1992 | Moallemi et al. |
| 5,194,860 A | * | 3/1993 | Jones et al. ............. 340/870.02 |
| 5,201,834 A | | 4/1993 | Grazioli et al. |
| 5,239,468 A | | 8/1993 | Sewersky et al. |
| 5,309,351 A | * | 5/1994 | McCain et al. ......... 340/825.06 |
| 5,414,494 A | * | 5/1995 | Aikens et al. ................. 399/21 |
| 5,433,111 A | | 7/1995 | Hershey et al. |
| 5,442,810 A | | 8/1995 | Jenquin |
| 5,594,953 A | | 1/1997 | Ross et al. |
| 5,602,749 A | * | 2/1997 | Vosburgh .................... 700/174 |
| 5,708,964 A | | 1/1998 | Meger et al. |
| 5,757,281 A | | 5/1998 | Schwendeman et al. |
| 5,790,951 A | | 8/1998 | Tayloe et al. |
| 5,845,230 A | | 12/1998 | Lamberson |

FOREIGN PATENT DOCUMENTS

| | | |
|---|---|---|
| WO | WO 97/06499 | 2/1997 |
| WO | WO 97/35432 | 9/1997 |

OTHER PUBLICATIONS

Franklin P. Antonio, et al., "OmniTRACS: A Commercial Ku–Band Mobile Satellite Terminal and its Applicability to Military Mobile Terminals", *IEEE* pp. 0761–0764 (1988).

Irwin M. Jacobs, "An Overview of the OmniTRACS: The First Operational Two–Way Mobile Ku–Band Satellite Communications System", *Elsevier Space Communications* 7:25–35 (1989).

Edward G. Tiedemann, Jr., et al. "The OmniTRACS Mobile Satellite Communications and Positioning System", pp. 503–507 (date unknown).

* cited by examiner

Primary Examiner—Brian Zimmerman
Assistant Examiner—Yves Dalencourt
(74) Attorney, Agent, or Firm—Knobbe, Martens, Olson and Bear, LLP.

(57) ABSTRACT

Vibration data is transmitted from a remote site to a control facility using wireless data transmission. In one embodiment, the vibration signal is conditioned and digitized, and then sent via a page transmitter to the control facility.

3 Claims, 6 Drawing Sheets

APPARATUS AND METHOD FOR THE REMOTE MONITORING OF MACHINE CONDITION

CROSS REFERENCE TO RELATED APPLICATIONS

This application claims priority to and is a continuation-in-part of U.S. pat. application Ser. No. 08/791,246, filed Jan. 30, 1997, U.S. Pat. No. 5,845,230, which application claims priority to U.S. Provisional Patent Application Ser. No. 60/010,839, filed Jan. 30, 1996. The disclosure of application Ser. Nos. 08/791,246 and 60/010,839 are hereby incorporated by reference in their entireties.

BACKGROUND OF THE INVENTION

1. Field of the Invention

The present invention relates to vibration monitoring sensors and equipment. More specifically, the present invention relates to the remote monitoring of the condition of rotating machinery with vibration sensors when it is difficult or unsafe to retrieve data from the sensors locally.

2. Description of the Related Technology

The need to accurately predict excessive wear, functional abnormalities, or the imminent malfunction of machines such as pumps, turbines, and the like is well known. It has become common to use vibration transducers which convert an operating machine's mechanical vibrations into an electrical signal which can be analyzed for characteristics which indicate abnormal operation or the need for maintenance. It can be appreciated that resources can be more efficiently utilized in manufacturing facilities and other environments when machine failure can be predicted, and the machine fixed or replaced prior to catastrophic failure. Human safety is also improved if the incidence of significant machine malfunction is reduced or eliminated.

Two approaches have been used to generate the vibration data necessary to perform these monitoring functions. In some installations, a portable probe is carried around the facility by facility personnel, and is used to collect vibration data from various locations on the machinery being monitored. These portable probes may include an integral vibration transducer, or may utilize fixed transducers at the points to be measured. Such a system is described in U.S. Pat. No. 4,885,707 to Nichol, et al. In the apparatus disclosed by Nichol, a computer interface module is also included for communication of measurement parameters and vibration data between the portable probe and a host computer system at the facility.

An alternative design, one example of which is provided in U.S. Pat. No. 5,430,663 to Judd, et al., includes a plurality of fixed transducers connected by a common bus which interfaces with an on-site host computer system.

A variation of these two systems is disclosed in U.S. Pat. No. 4,621,263 to Takenaka, et al. In this system, a robot with a non-contact vibration sensor moves throughout the facility, communicating vibration data to a host computer system either with a hard-wired cable connection, or alternatively with a wireless communication link. This robotic device is stated to be especially useful in nuclear power plants, where the use of plant personnel to gather vibration data may expose people to unacceptable hazardous environments.

In all of the above-described systems, however, a locally based vibration monitoring presence is required. In most cases, monitoring personnel collect data at the machines themselves. In some cases, data is routed via communication cable to an on-site host monitoring computer which is itself manned by facility personnel. In many applications, however, it is infeasible to maintain any local presence for the purpose of vibration monitoring. Some pipeline sections, pumping stations, and the like may include a very small number of machines to be monitored, and be located tens or even hundreds of miles away from a suitable host location. In such situations, equipment is often allowed to run to failure because vibration monitoring to diagnose abnormalities cannot be performed.

There is accordingly a need in the art to provide remote vibration monitoring in a cost effective manner to allow efficient maintenance of such remote machines. To date, no long distance communication method has been considered and applied to this problem. It may be noted that satellite communication techniques have been applied to vibration data gathering in the electric power distribution industry, as is described in U.S. Pat. No. 5,029,101 to Fernandes, and in the railroad transportation industry, as is described in U.S. Pat. No. 5,433,111 to Hershey, et al. In these fields, however, installation and management of dedicated long distance communication links is often already performed for other purposes, and is also more economically justifiable for a huge number of railroad cars, for example, than when a fairly small number of stationary and remote machine installations must be monitored.

Furthermore, those of skill in vibration data collection and analysis at facilities having stationary rotating machinery are typically not trained or extensively exposed to digital electronics or communications technologies. This general unfamiliarity in the relevant art with the capabilities of these technologies has slowed their application to machine monitoring. In fact, the employment of digital technology in vibration data collection is often resisted as its use is perceived to introduce undesired complexities into facility management. A remote monitoring system should therefore be easy to install and use, and should require a minimum of specialized on-site electronics which must be configured and maintained by process control management.

SUMMARY OF THE INVENTION

The present invention provides an efficient and easily managed communication link between a remote stationary machine and a control room having a host control computer system for analysis of machine condition and process control. Most preferably, embodiments of the present invention allow wireless communication between the remote site and the host control facility over communication links supported by an existing infrastructure. This minimizes the amount of communications equipment which must be managed by facility managers, thereby freeing them to concentrate on bearing fault analysis and machine maintenance. In particularly preferred embodiments, a portion of the communication link between the monitored machine and the host control room comprises a paging network.

Thus, in one embodiment, the invention comprises a vibration monitoring system comprising a vibration transducer connected to vibrating machinery, signal conditioning circuitry configured to produce digital data indicative of the condition of the vibrating machinery, as well as a memory storing at least a portion of the digital data. The system may further comprise a page transmitter connected to the memory so as to transmit the digital data to a host computing system for analysis.

The invention also comprises methods of machine monitoring and methods of making vibration monitors. In one embodiment, a method of monitoring the condition of a machine comprises sensing a vibration level of the machine, storing the vibration level in a memory, and sending a page containing data from the memory to a host. In another embodiment, the invention comprises a method of making a machinery condition monitor comprising connecting a two-way page transceiver to a vibration transducer and connecting a memory to both the vibration transducer and the two-way page transceiver such that vibration data may be stored in the memory and forwarded to a host monitoring system via alphanumeric page messages.

These apparatuses and methods thus defined provide high quality vibration data communication links without requiring process control management to develop, install, and maintain an extensive collection of communication equipment.

DETAILED DESCRIPTION OF THE PREFERRED EMBODIMENT

Preferred embodiments of the present invention will now be described with reference to the accompanying Figures, wherein like numerals refer to like elements throughout. The terminology used in the description presented herein is intended to be interpreted in its broadest reasonable manner, even though it is being utilized in conjunction with a detailed description of certain specific preferred embodiments of the present invention. This is further emphasized below with respect to some particular terms used herein. Any terminology intended to be interpreted by the reader in any restricted manner will be overtly and specifically defined as such in this specification.

Figure 1:
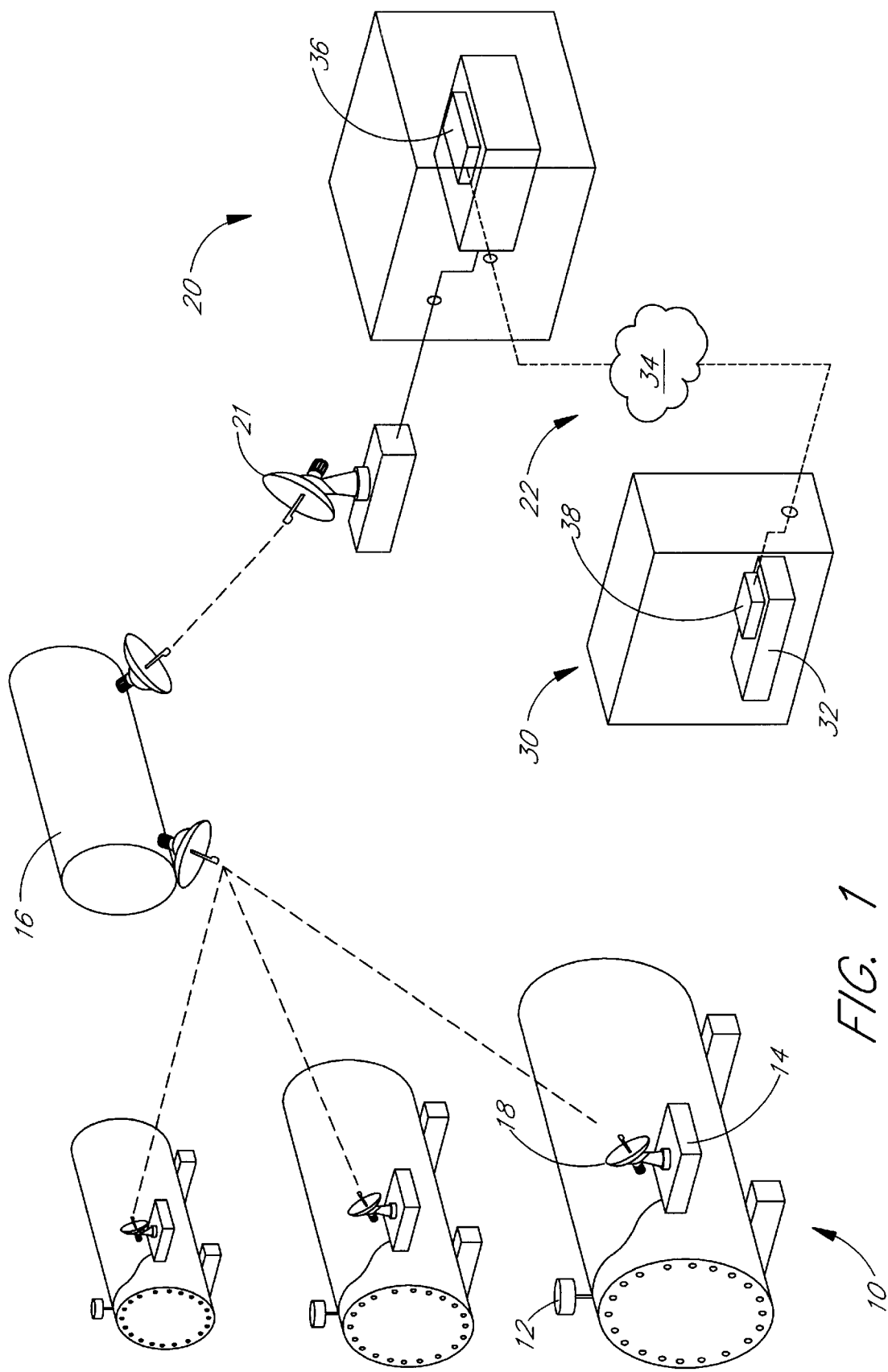
FIG. 1 is an illustration of a communication system connecting a stationary machine being monitored and a control room in accordance with one embodiment of the present invention.

Referring now to FIG. 1, a communication system in accordance with a preferred embodiment of the present invention is illustrated. A piece of machinery 10, a high speed pump for example, is located in a remote region relatively far from the location of facility management personnel. It is accordingly difficult and expensive to send a person to the pump itself to gather vibration data from the pump for evaluating its condition. It can be appreciated of course, that in some installations, along an oil pipeline, for example, several stationary machines (or several installations of groups of machines) may be periodically placed, each remote from one another. In these cases, several or all of the separate machines may require monitoring and periodic maintenance. In the following discussion, an individual installation of rotating machinery 10 is explicitly described, it being understood that the present invention may be utilized in an analogous manner with each additional separate installation.

The stationary machine 10 is provided with a vibration transducer 12 mounted to convert mechanical pump vibrations to an output analog electrical signal. Suitable transducers for this purpose are well known to those of skill in the art. Many standard configurations are described in the Third Edition of ANSI/API Standard 670, dated November 1993, the disclosure of which is hereby incorporated by reference in its entirety.

The transducer interfaces to a signal conditioner 14, which conditions and digitizes the analog transducer output signal as will be described in more detail below with reference to FIGS. 2 and 3. The digitized data is then preferably transmitted to a satellite 16 with a dedicated dish antenna 18. The dish antenna 18 can comprise a standard Very Small Aperture Terminal (VSAT) dish transceiver or any other satellite transmission antenna. In many applications, antenna size will be an important concern, in addition to cost. Those of skill in the art will be readily able to select an appropriate antenna type for a particular application.

The satellite 16 then retransmits the data to a hub receiver station 20, which includes a satellite receiving antenna 21. In many preferred embodiments of the present invention, the hub receiving station 20 will not need to be controlled or managed by the process control management, as communications services are commercially available to provide such satellite downlinks. This reduces the burden on pump facility management and allows them to concentrate on data analysis and facility maintenance, rather than on the operation and upkeep of a communications system.

It can of course be appreciated that the data received by the hub receiving station must be then transmitted to the process control management. In some embodiments of the present invention, process control management is located at the hub receiving station, and no additional communication link is required. In some other embodiments, however, a communication link 22 is preferably provided between the hub receiving station 20 and a control room 30 containing the host monitoring computer system 32. In some applications of the present communication system, facility control and management is at a location remote from both the stationary monitored machine 10 and the hub receiving station 20. The communication link 22 may then advantageously comprise the public switched telephone network (PSTN) 34. The communication link 22 may also comprise a private telecommunications network, and may further include additional satellite links, microwave transmission, etc. As another alternative, the link 22 may comprise a packet switched network such as the Internet. In these embodiments, both the hub receiving station 20 and the control room 30 additionally comprise modems 36, 38 for data communication over the telephone line. Many of the above described embodiments further enhance the advantageous characteristics of the present system in that almost the entire communication link from the machine 10 to the control room 30 is supported by an existing communication infrastructure which is owned and managed by entities outside the process control management.

At the control room 30, the vibration data taken by the transducer 12 can be analyzed, and appropriate action according to the results of the analysis are then taken. In one embodiment, two way communication exists between the pump 10 and the control room 30. In this case, the control room 30 can send a command to the pump to shut down if the vibration measurements made by the transducer 12 indicate that bearing failure is imminent. In many cases, commands from the control room 30 will not be necessary, and the vibration data received by the control room 30 will be used to schedule appropriate maintenance procedures when the measured vibration data indicates that such maintenance is required. In some cases, personnel may be dispatched to manually shut down the machine 10 being monitored. The present system therefore incorporates a capacity for remote automatic machine 10 control, as well as increasing the efficiency of manual machine 10 control and maintenance.

Preferred components of the vibration data communication system of FIG. 1 will now be described with reference to FIG. 2. At the site of the stationary machinery 10, a vibration transducer is mounted so as to receive a mechanical acceleration signal from the machine, and translate that into an electrical signal. In typical applications, the transducer 12 comprises a piezoelectric crystal and an integral analog amplifier inside a housing. The transducer will generally also be provided with an output connector for outputting a voltage which varies with the instantaneous acceleration of the point on the machine 10 that the transducer contacts. Of course, the physical nature of the vibration transducer can vary and remain within the scope of the present invention, and the term "vibration transducer" is not hereby limited to any particular construction. Many different transducer configurations and modes of coupling them to stationary rotating machinery are well known. Some are described in the ANSI/API Standard 670-1993 mentioned above, and would be suitable for use with the present invention.

The transducer output is connected to an input to conditioning and A/D conversion circuitry 40. This circuitry can be configured to perform a variety of functions. In many applications, the analog acceleration signal is filtered to produce a varying DC voltage or current signal which is representative of the peak or RMS acceleration, velocity, or relative position of the transducer. As is well known to those of skill in the art, a variety of filtering techniques may be used to extract information regarding the performance and condition of the bearings in the stationary machinery 10. The filtered and conditioned signal is then sampled with an A/D converter to produce a series of digitized signal values. Of course, A/D conversion can occur at a rate which varies depending on the frequencies of interest in the signal being sampled. In some applications, the transducer output may be only amplified prior to A/D conversion and not conditioned or filtered. In this embodiment, conditioning and processing can be done at the control room 30. This can allow additional analysis flexibility, as the control room receives raw transducer data, and can process that data in various ways depending on the parameters of interest, recent history of the bearing being monitored, etc. In yet another alternative embodiment, the nature of processing performed by the conditioning and A/D conversion circuitry can be programmed with signals sent from the control room 30 to the remote site 10. In this embodiment, the conditioning circuit 40 may additionally comprise a memory, wherein commands stored in the memory control the particular conditioning function and filtering performed at a given time. Commands may be sent from the control room 30 for storage in the memory, thereby allowing remote control of the conditioning function, filter parameters, etc.

The conditioning and A/D conversion circuit outputs the digital data to an optional memory 42 which may comprise a non-volatile memory and be utilized to store data temporarily prior to transmission over the satellite communication link. The memory 42 may alternatively comprise a FIFO buffer which continually outputs, in real time, vibration data received from the conditioning and A/D conversion circuitry. This vibration data therefore comprises a baseband data stream which is routed to a modulator 44. The modulator 44 uses the baseband signal to modulate a signal for transmission to the satellite 16 at standard uplink frequency bands such as the Ku band.

In some preferred embodiments, additional transducers 12a, 12b and conditioning circuits 14a, 14b, may be provided on the machine 10 being monitored, or on other machines in close proximity to the machine 10 explicitly discussed above. In this case, the digital vibration data from all of the transducers 12, 12a, 12b can be multiplexed prior to modulation and transmission via the satellite link. Alternatively, each transducer/conditioner could include a dedicated satellite antenna for an independent link to the hub receiving station 20.

As was also explained above with reference to FIG. 1, the vibration data is transmitted from the satellite 16 to the receiving antenna 21 at the hub receiving station 20. It is there demodulated with a demodulator 50, and the digital data is stored in a memory 52 at the hub receiving station 20. As the hub 20 may be located a substantial distance from the control room 30, a communication link, preferably comprising the public switched telephone network 34, is provided from the hub receiving station 20 to the control room 30. The link through the telephone network can be continuously connected to provide real-time transfer of vibration data to the control room, or the link could be made periodically as the control room desires to receive information. In the latter case, the memory 52 can be used to store the vibration data until it is downloaded to the control room 30 via a telephone connection made between the control room 30 and the hub 20. As mentioned above, the hub 20 and control room 30 may be co-located at the same facility, in which case there is no need to use the telephone network.

Figure 2:
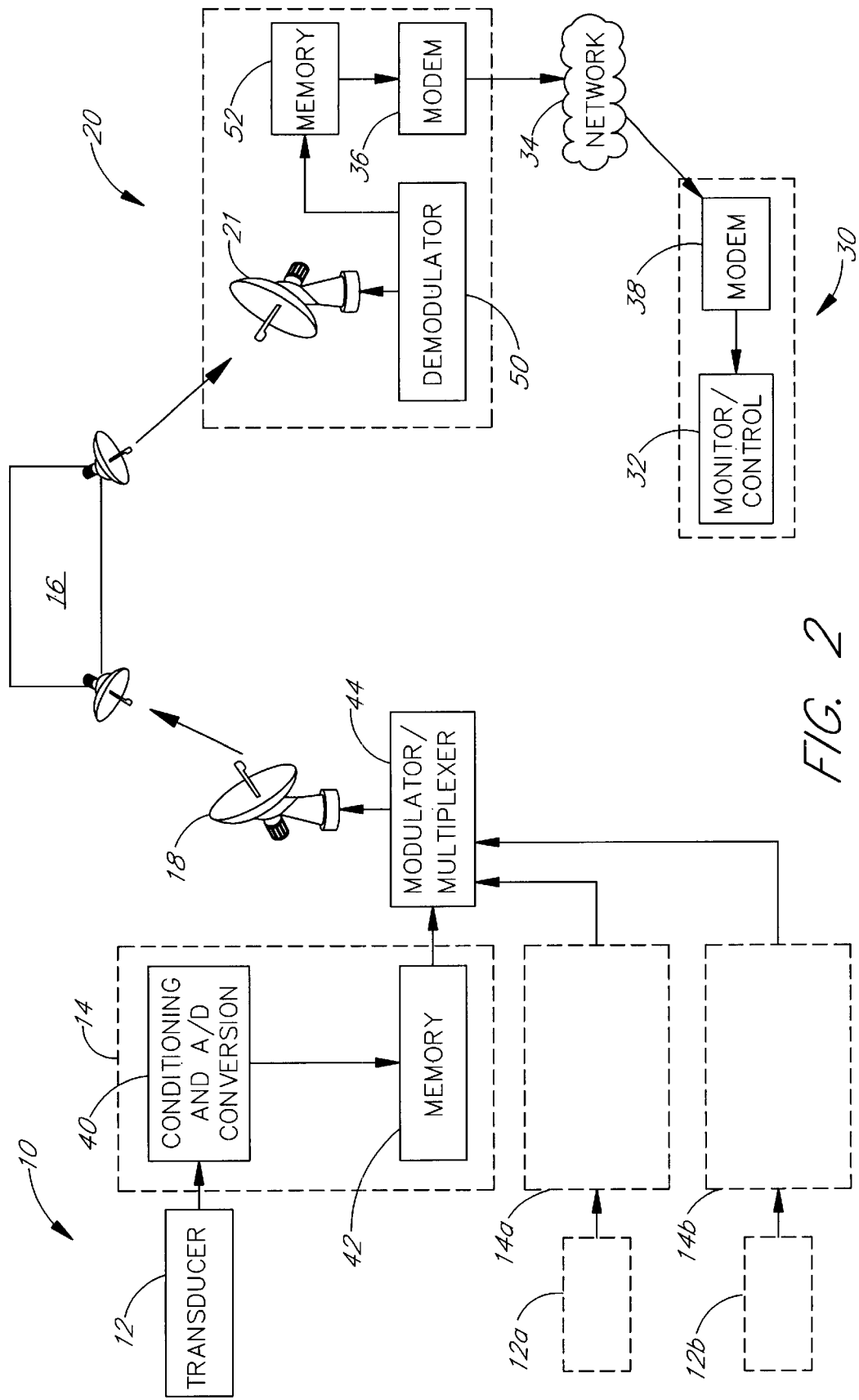
FIG. 2 is a block diagram of the components of a vibration data communication system in accordance with one preferred embodiment of the present invention.
Figure 3:
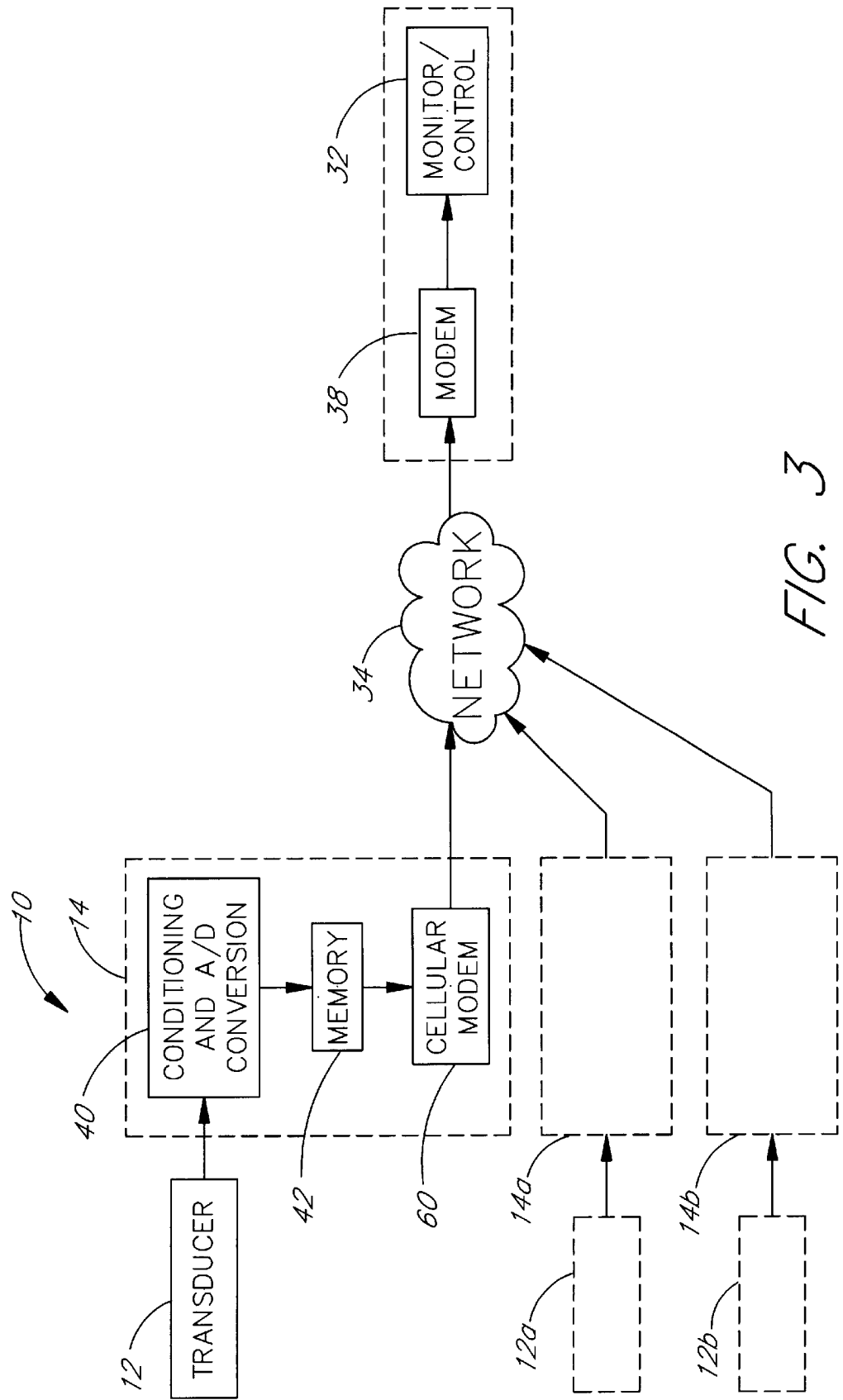
FIG. 3 is a block diagram of the components of a vibration data communication system in accordance with a second preferred embodiment of the present invention.

An alternative embodiment of the present invention is illustrated in FIG. 3. In this embodiment, a satellite link is not necessarily present, but the advantages of the embodiment of FIG. 2 are preserved in that the communication link between the stationary machine being monitored 10 and the control room is supported by an existing infrastructure which need not be maintained and managed by the facility personnel who perform the vibration analysis and direct machine 10 operation.

The embodiment illustrated in FIG. 3 is analogous to that illustrated in FIG. 2 in that the transducer 12 is connected to conditioning and AID conversion circuitry 40, which is in turn connected to the memory 42. The output of the memory 42, however, is input to a modem 60 which transmits directly to a communication network 34. This network 34 may comprise a private network, a public cellular telephone network, may include a satellite and/or microwave link, or may be wholly terrestrial. The data is then received by the modem 38 at the control room over a control room 30 connection to the network in a manner similar to that described above with respect to FIGS. 1 and 2. In effect, the transducer (or the control room) connects to the control room (or the transducer) over the network 34 when vibration data transmission is desired. Of course, this embodiment requires that either terrestrial or satellite cellular telephone service be supported in the area where the stationary machine 10 is located. In this embodiment as well, therefore, communication between the machine 10 and the control room 30 is easily managed and maintained by facility personnel. Facility managers simply connect the transducer 12 to the conditioning/wireless transmission circuit 14, and receive vibration data into the control room 30 from that transducer 12 via a standard telephone line. It will be appreciated by those of skill in the art than many communication protocols may be used with the present invention, including any of a number of switching techniques utilized and proposed for use in telecommunications networks, as well as techniques used in local or wide area computer networks.

Figure 4:
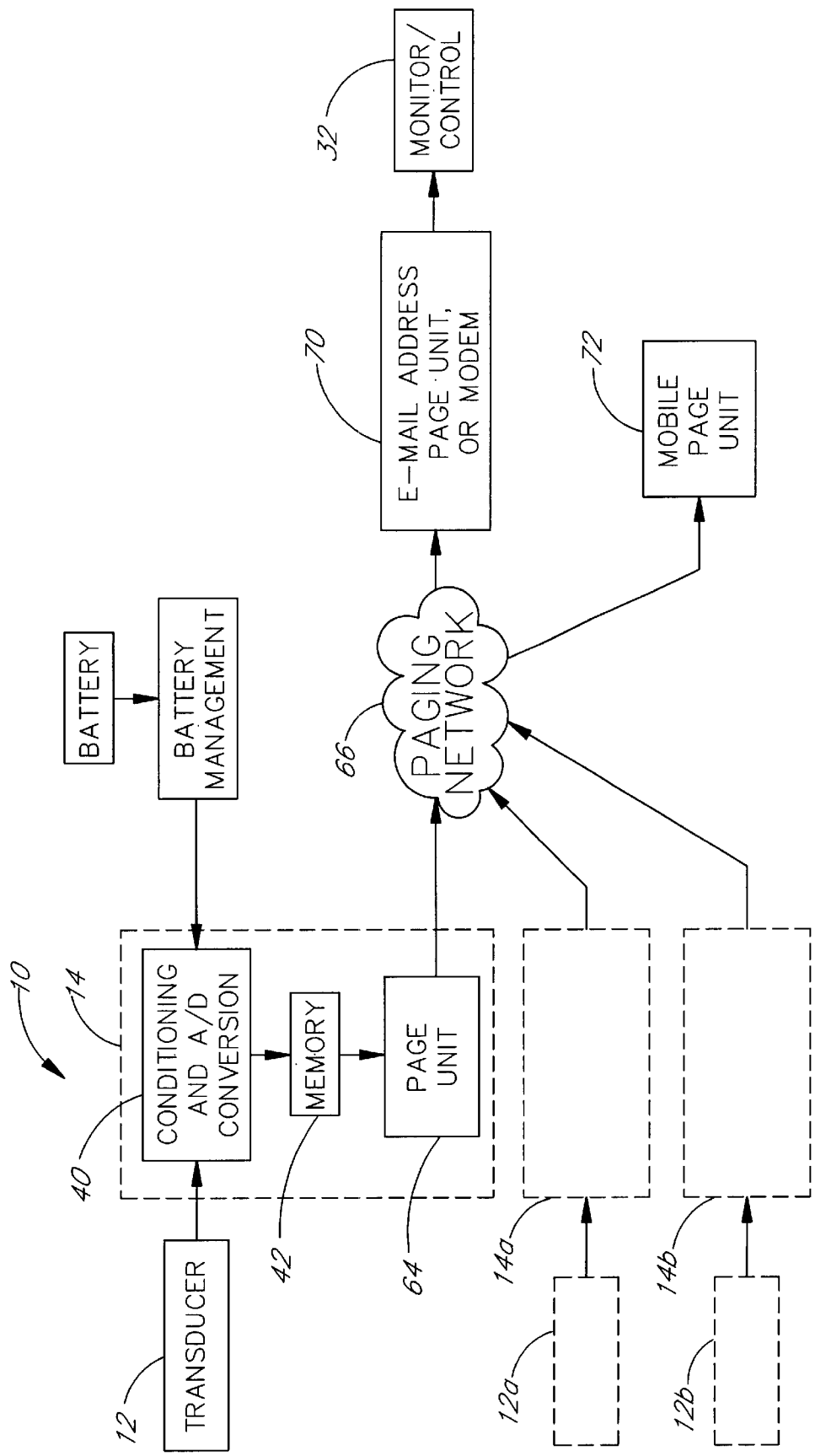
FIG. 4 is a block diagram of the components of a vibration data communication system in accordance with a third preferred embodiment of the present invention.

An additional advantageous wireless communication system for vibration data is illustrated in FIG. 4. In this system, the transducer 12 is again connected to conditioning and A/D conversion circuitry 14. A memory 42 is also connected to receive and store vibration data produced by the transducer 12. In this embodiment, the machine being monitored is also advantageously provided with a page unit 64, which may include both a page transmitter circuit and page receiver circuit for two way communication with the host monitoring and control equipment 32.

This communication between the machine being monitored and the host computer system 32 in the control room 30 occurs over a paging network 66. A paging network is one which permits the broadcast of brief messages, typically short numeric or alphanumeric strings, to a subscriber of the paging service. The subscriber is often mobile and carries a page receiver only, but this is not always the case. Page networks are created with several features and constraints in mind, and are surprisingly applicable to the distribution of vibration data to remote monitoring facilities, and for the transmission of commands from the remote monitoring facilities to the machine being monitored.

Pager system design is tailored to make the local page receivers and transmitters very simple and inexpensive. Another characteristic of typical paging systems is that the portable antenna and associated circuitry is small in size and must be able to function properly regardless of orientation and location. In many cases, the antenna location is inside a structure, vehicle, and/or is held close to a person's body or other object which can interfere with wireless signal reception.

Page broadcasting systems are designed to provide reliable communication within these constraints on the mobile page units. For example, a large number of distribution antennas are often used in the paging network to maximize signal strength throughout what is often a huge coverage area. In addition, a high signal-to-noise ratio is especially desirable given the limitations of the page receivers. This is generally accomplished by using a relatively low carrier frequency (generally 100–900 Mhz) and a narrow signal bandwidth which limits the data transfer rate considerably. Page data transfer rates are typically 9600 bits per second or less. Thus, a paging system may be generally characterized as a wireless communication system adapted to provide reliable, short duration communication at low data rates, using low cost and often portable message receivers.

Although paging networks have been implemented separately from other wireless communication systems such as cellular telephone service, it is likely that more intelligent and flexible communication systems will be widely used in the future. A Personal Communication Services (PCS) system may be deployed which combines many different types of voice and data communication services, including the transmission of page messages. These systems may utilize a high data rate full duplex communication hardware infrastructure for all transmissions. However, even as part of these more comprehensive communication networks, paging retains its character as a simplex or half-duplex form of communication for short strings of data which are broadcast over a given coverage area in which a page receiver is registered.

These characteristics of paging networks make them surprisingly suitable for the communication of vibration data in machine monitoring applications. Because page receivers and transmitters are designed to be inexpensive, installation cost as part of a local vibration data collection circuit at a machine can be relatively low. Often, the cost is far less than the cost of route-based manual data collection or the laying of dedicated lines from the machine to host monitoring equipment. Airtime cost is also inexpensive when compared to high data rate, full duplex communication services such as cellular telephone.

In a two-way messaging system applicable to the vibration monitoring system illustrated in FIG. 4, an outbound message containing vibration data may be sent by the page unit 64 local to the machine being monitored. In many typical page networks 66, this outbound message will be received by one or more network receivers. The message is sent to a central network controller, which determines the message destination. The message is then forwarded to its destination either by land line, microwave repeater, or satellite link, for instance.

In the embodiment of FIG. 4, the destination 70 is connected to the host monitor/control system 32, where the message is evaluated and analyzed. The page destination 70 may be an e-mail address, a modem connected to the public switched telephone network (PSTN), or another page unit (also preferably also having a page receiver and transmitter) at the control room 30. An alternative or additional destination for the page sent from the page unit 64 may be a mobile page unit 72. This mobile page unit 72 may be carried by a facility manager or technician that wishes to be kept informed of machine condition when access to the host monitoring system 32 is limited. The mobile page unit 72 may in some embodiments also include page transmission capabilities as well, so that a mobile facility manager or other user can send page messages as well as receive them.

As is common in paging systems, the page message sent by the page unit 64 may be a short alphanumeric message. The page may therefore comprise an overall vibration measurement value, such as an enveloped acceleration measurement. The page message sent from the page unit 64 may also be simply an alarm, indicating that a measurement has been taken which exceeds a programmed threshold. It will be appreciated that the low data rates of typical page systems do not lend themselves to continuous real time transmission of vibration data However, this is unnecessary in almost all applications, and effective monitoring can be performed with infrequent page communication of short alphanumeric messages. A page length of less than 100 characters, or even less than about 50 characters, is sufficient to transmit a machine or transducer identification and an associated vibration measurement and/or alarm indication. In addition, periodic page transmission fewer than five times per day is usually more than satisfactory for machine monitoring, with once per day being suitable for many applications. As the cost of airtime from a paging network provider may be a significant portion of cost of the system, minimizing page frequency and length also reduces system cost.

In many applications, the data conditioning and paging circuitry 14 will be battery powered. In these cases, it will be appreciated that reductions in energy consumption are desirable. It is advantageous in these instances to provide a battery management circuit which only powers those portions of the circuitry 14 necessary at any one time. Reductions in the number and length of page messages will also enhance battery life. Several variations in operation are possible. For example, the unit may be programmed to power up the data conditioning circuit 40 periodically in order to take a measurement and store the data in the memory 42. Sending a page with the page unit 64 may occur immediately after this data acquisition, or may occur later. As will be explained below with reference to FIG. 5, vibration data acquisition and/or transmission may take place in response to a page received from either the host monitoring system 32 or the mobile paging unit 72 if the mobile paging unit has page transmission capabilities.

Figure 5:
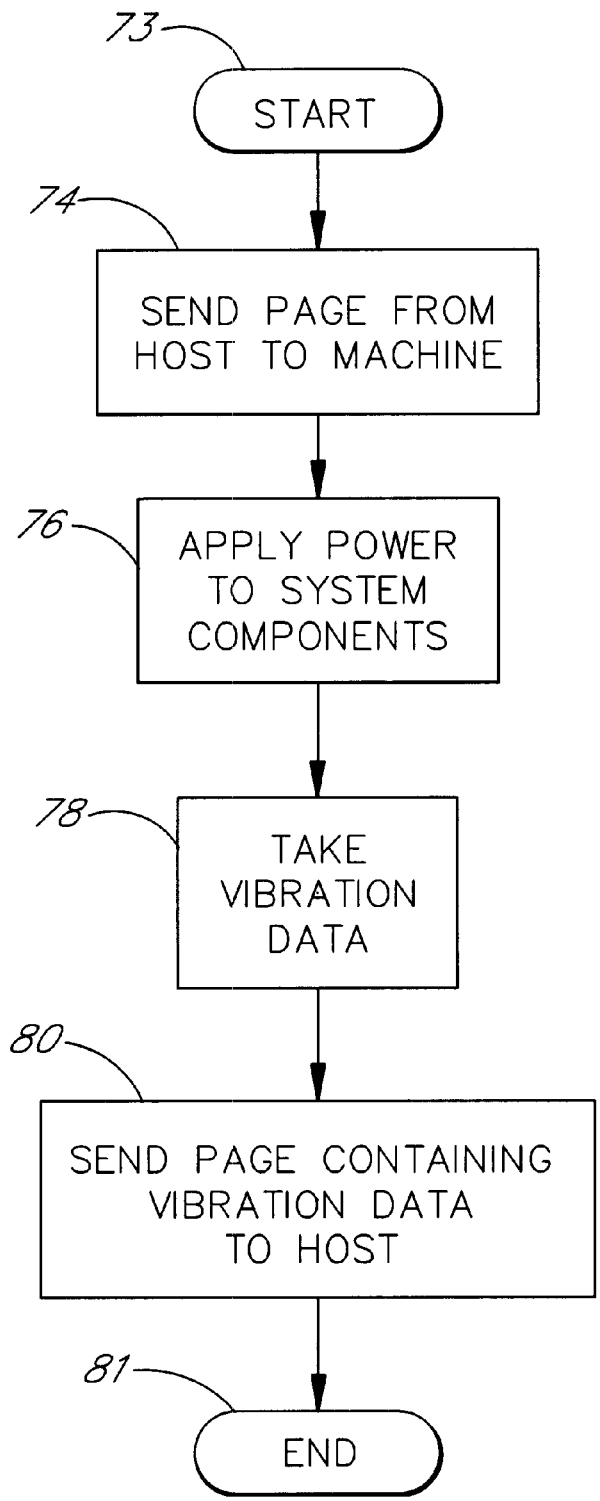
FIG. 5 is a flowchart illustrating a method of vibration data communication which may be implemented with the system illustrated in FIG. 4.

Advantageous two-way page communication may be implemented with the system illustrated in FIG. 4. One embodiment of such a communication method is illustrated in FIG. 5. In this method, the system moves from a start block 73 and the communication method is initiated at block 74 with a page from the host 32 to the machine being monitored. At block 76, in response to the page from the host 32, required portions of the vibration data monitoring circuitry at the machine are provided with. battery power. These portions may include circuits required for signal acquisition and conditioning and/or page transmission circuitry. At block 78, vibration data is collected, processed, and stored in the memory 42. At block 80, the vibration data stored in the memory 42 is sent to the host 32 in a page message. The communication is then completed as represented by end block 81. In this implementation, data acquisition and transmission is initiated by the original page from the host 32. In other embodiments, data acquisition and transmission may be performed automatically at periodic intervals, rather than being initiated by a page from the host 32. In another alternative embodiment, data acquisition and/or transmission is initiated by a page from the mobile page unit 72 if this page unit 72 has page transmission capabilities. It will also be appreciated that the data acquisition functions and data transmission functions may be performed at separate times, and may also be separately initiated by different page messages.

Figure 6:
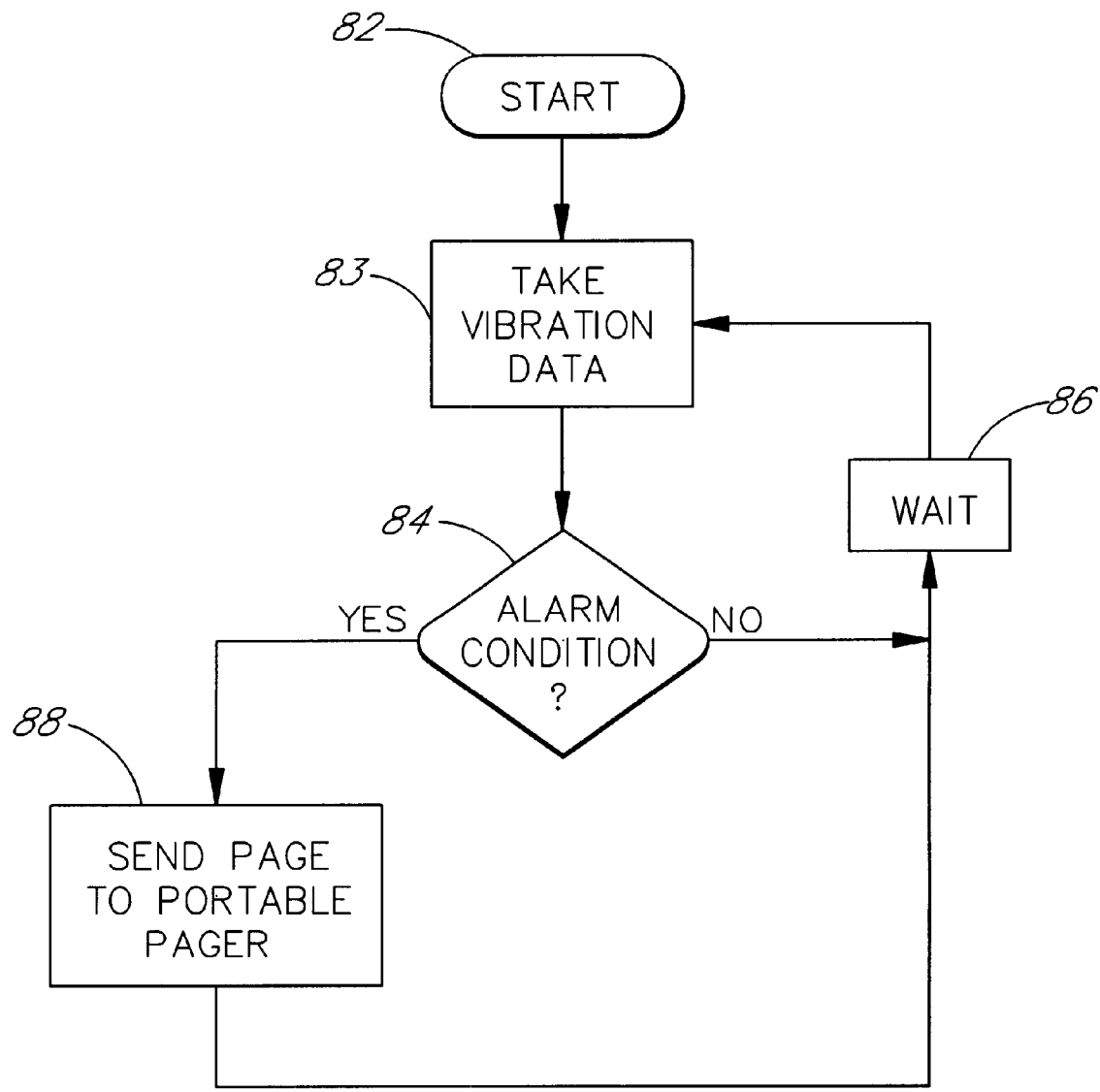
FIG. 6 is a flowchart illustrating a second method of vibration data communication which may be implemented with the system illustrated in FIG. 4.

FIG. 6 illustrates another embodiment of a communication method which may be implemented with the system illustrated in FIG. 4. This method begins at a start state 82, and moves to block 83 where vibration data is taken at the machine being monitored, and which may then be stored in the memory 42. As described above, this data acquisition block 83 may be performed automatically at periodic intervals, or may be initiated by a received page message. At block 84, the vibration data measurement may be compared to a threshold stored in a memory at the machine being monitored to determine if an alarm condition is present. If not, page transmission may not occur, and the system will move to block 86, where the system waits for the next data acquisition. If the measured vibration value is greater than the threshold, and an alarm condition exists, the page transmitter/transceiver 64 may send an alarm page to a portable pager at block 88. As mentioned above, the portable pager may be worn by a facility manager that is interested in being informed immediately if a machine appears to be operating in a faulty manner.

The foregoing description details certain preferred embodiments of the present invention and describes the best mode contemplated. It will be appreciated, however, that no matter how detailed the foregoing appears in text, the invention can be practiced in many ways. As is also stated above, it should be noted that the use of particular terminology when describing certain features or aspects of the present invention should not be taken to imply that the broadest reasonable meaning of such terminology is not intended, or that the terminology is being re-defined herein to be restricted to including any specific characteristics of the features or aspects of the invention with which that terminology is associated. The scope of the present invention should therefore be construed in accordance with the appended claims and any equivalents thereof.

What is claimed is:

1. A vibration monitoring system comprising:

a vibration transducer connected to vibrating machinery for collecting raw vibration measurements;

signal conditioning and digitizing circuitry connected to said vibration transducer and configured to process said raw vibration measurements to produce digital data indicative of the condition of said vibrating machinery;

a memory receivably connected to said digital conditioning and digitizing circuitry and storing at least a portion of said digital data;

a first page unit connected to said memory, wherein said first page unit is configured to transmit at least a portion of said digital data using page network frequencies and signaling protocols to a mobile page unit, and wherein said first page unit and said mobile page unit are configured to transmit and receive page messages.

2. The system of claim 1, further comprising a battery management circuit that only powers those portions of said signal conditioning and digitizing circuitry necessary to produce said portion of said digital data for transmission to said mobile page unit.

3. A method of monitoring the condition of a machine comprising:

connecting a vibration transducer to said machine for collecting raw vibration measurements;

connecting signal conditioning and digitizing circuitry to said vibration transducer;

configuring said circuitry to process said raw vibration measurements to produce an overall average vibration amplitude value encoded as an alphanumeric string indicative of the condition of said machine;

connecting a memory to said circuitry and storing at least a portion of said digital data;

sending a request page from a mobile page unit to said machine, wherein said mobile page unit is configured to transmit and receive page messages, and wherein said request page consists essentially of an alphanumeric string which contains a request for data indicative of said machine's condition; and in response thereto, sending a response page to said mobile page unit via a page unit local to said machine, wherein said response page consists essentially of said alphanumeric string, and wherein said data is based at least in part on a processing of a plurality of vibration measurements collected from said machine, and wherein said page unit local to said machine is configured to transmit and receive page messages.

* * * * *